(12) United States Patent
Kang et al.

(10) Patent No.: US 7,332,252 B2
(45) Date of Patent: Feb. 19, 2008

(54) METHOD OF FORMING A MASK LAYOUT AND LAYOUT FORMED BY THE SAME

(75) Inventors: Chun Soo Kang, Seoul (KR); Byoung Sub Nam, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/618,639

(22) Filed: Dec. 29, 2006

(65) Prior Publication Data
US 2007/0248893 A1    Oct. 25, 2007

(51) Int. Cl.
*G03F 9/00* (2006.01)
(52) U.S. Cl. .............................. 430/5; 430/30; 430/296; 430/942; 716/19
(58) Field of Classification Search .................. 430/5, 430/30, 296, 942; 716/19–21
See application file for complete search history.

(56) References Cited

U.S. PATENT DOCUMENTS

| 6,887,630 | B2 * | 5/2005 | Luttrell .......................... 430/5 |
| 7,010,764 | B2 | 3/2006 | Pierrat |
| 7,022,439 | B2 * | 4/2006 | Luttrell .......................... 430/5 |
| 2003/0159125 | A1 | 8/2003 | Wang et al. |
| 2004/0205686 | A1 | 10/2004 | Luttrell |
| 2004/0205687 | A1 | 10/2004 | Luttrell |
| 2005/0091632 | A1 | 4/2005 | Pierrat et al. |

* cited by examiner

*Primary Examiner*—Christopher G Young
(74) *Attorney, Agent, or Firm*—Townsend and Townsend and Crew LLP

(57) ABSTRACT

A mask layout forming method includes designing an original layout in which a diagonal pattern of a first polygon is repeatedly arranged in a diagonal direction relative to a vertical-axis direction. Opposite edge sides of the diagonal pattern of the first polygon are corrected such that second polygons extending in a horizontal-axis direction are stacked at the opposite edge sides of the diagonal pattern of the first polygon to form a stair-shaped layout. The polygons are fractured in the horizontal-axis direction to provide data associated with the corrected layout to an electron beam exposure system. The diagonal pattern of the first polygon defines an active region and a device isolation layer along a $6F^2$ cell layout or a $4F^2$ cell layout.

20 Claims, 6 Drawing Sheets

METHOD OF FORMING A MASK LAYOUT AND LAYOUT FORMED BY THE SAME

CROSS-REFERENCES TO RELATED APPLICATIONS

The present application claims priority to Korean patent application number 10-2006-037346, filed on Apr. 25, 2006, which is incorporated herein by reference in its entirety.

BACKGROUND OF THE INVENTION

The present invention relates to manufacturing a semiconductor device, and more particularly, to a method of forming a mask layout using a fracturing process that is required for electron beam exposure or electron beam writing, and a mask layout formed by the same.

As the integration of a semiconductor device increases, the reduction in a design rule also occurs. As a result, the likelihood of distortion increases during the transfer of a pattern onto a photo mask due to a resolution restriction when using lithography to form the pattern. A resolution enhancement technology, such as optical proximity correction (OPC), has been proposed to overcome the resolution restriction of lithography.

Several attempts have been made to change the array of a device disposed on a wafer to increase the integration of the device. For example, a cell layout may be changed from an $8F^2$ cell layout to a $6F^2$ cell layout or a $4F^2$ cell layout for a dynamic random access memory (DRAM) device.

According to the change of the cell layout, the shape of a pattern to be transferred onto a wafer has been changed into a diagonal pattern. For example, in the $6F^2$ layout, a pattern for a device isolation layer to form an active region does not extend in the horizontal direction perpendicular to a word line. Rather, the pattern extends diagonally to intersect a word line at an angle other than 90 degrees (e.g., an angle of approximately 27 degrees).

After the OPC process is performed on the layout having a diagonal pattern, it is necessary to perform an electron beam exposure process to transfer the layout onto a photo mask substrate. An extended time period may be required to perform the electron beam exposure process due to the shape of the electron beam.

FIG. 1 illustrates a conventional mask layout for a device isolation layer. FIG. 2 is an enlarged view of part C of FIG. 1. FIG. 3 illustrates the results of fracturing the mask layout of FIG. 1.

The cell layout illustrated in FIG. 1 may be a layout for a device isolation layer of a $6F^2$ cell in which a rectangle-shaped or polygon-shaped diagonal pattern 10 is arranged at an angle of approximately 27 degrees. The diagonal pattern 10 may be a layout to define an active region 13 and a device isolation region 14. The layout of the diagonal pattern 10 is represented by angle values representing the positions of vertices 15 of the polygon, which may be read by a computer aided design (CAD) system or an electron beam exposure system.

In the $6F^2$ cell layout, the diagonal pattern 10 extends at an angle of approximately 27 degrees (A) from the horizontal direction (X), which is a word line direction. The vertical direction (Y) is a bit line direction that is perpendicular to the horizontal direction (X). The diagonal pattern 10 is repeatedly arranged in the diagonal direction (A). In a subsequent process, fracturing is performed using this layout. The layout is then transferred onto a photo mask through electron beam exposure.

The $6F^2$ cell layout illustrated in FIG. 1 is a corrected layout obtained by the OPC process. The $6F^2$ cell layout includes a corrected pattern 16 having the shape of a serif polygon according to the OPC process. The corrected pattern 16 is merged with the diagonal pattern 10.

The corrected pattern 16 obtained by the OPC process has a shape in which a segment having a predetermined size is moved in the direction (B) perpendicular to a side 11 of the diagonal pattern 10. The direction (B) may be the same direction as an extension direction of an edge side 12 of the diagonal pattern 10. As illustrated in FIG. 2, vertices 17 are further provided by the merge of the corrected pattern 16 with the diagonal pattern 10. The corrected pattern 16 includes angle values representing the vertices 17.

An electron beam exposure process is performed when the layout of FIG. 1 with the above-described construction is transferred onto a photo mask. A vector-scan type electron beam exposure system, which uses a specific beam shape (e.g., a variable beam shape), can only expose a beam having a restricted shape (e.g., a rectangle or a trapezoid). The electron beam exposure system recognizes angle values of 0, 90, and 45 degrees that represent the rectangle or the trapezoid.

The layout data of FIG. 1 is converted into a data format that can be recognized by the electron beam exposure system. A fracturing process is performed to convert the layout into exposure elements related to the size of the exposed electron beam. FIG. 3 illustrates the results of fracturing the layout of FIG. 1.

Referring to FIG. 3, slivers 23 and 25, which are small-sized regions, may be undesirably generated between divided polygonal fractured regions 21 during the fracturing process. The silvers 23 and 25 are generated because the vertices 15 and 17 representing the diagonal pattern 10 and the corrected pattern 16 are represented by an angle value of 27 degrees. The only angle values that are recognized by the electron beam exposure system are 0, 45, and 90 degrees.

Generally, the fracturing direction is the horizontal direction (X). However, the vertices 15 and 17 each form an angle of predetermined size from the fracturing direction, for example 27 degrees. A plurality of slivers 23 are generated during the fracturing process in connection with the vertices 15 and 17.

The slivers 23 do not have a fractured region size, which is a relatively large size set by a user. Generally, the slivers 23 are automatically set to a minimum size allowed in the electron beam exposure system. The size of the slivers 23 is set to the minimum size allowable in a smaller-sized exposure system (e.g., 50 nm). The minimum size of the fractured region is set to a critical dimension of 100 nm.

The main fractured regions 21 are undesirably divided, and therefore slivers 25 may be generated between the divided fractured regions 21. When the fracturing process is performed on the corrected layout, a process is performed for enlarging (e.g., by 4 times) the CAD data of the corrected layout (FIG. 1). During a photolithography process (e.g., during a 1:4 reduction photolithography) a process for enlarging (e.g., by 4 times) layout data of FIG. 1 that is manufactured according to the design rule to be formed on a wafer using the CAD is required to perform the electron beam exposure on the photo mask.

Due to the vertices 17 generated when the corrected pattern 16 (FIG. 2) is merged with the diagonal pattern 10, undesirable vertices may be additionally generated at the side 11 of the diagonal pattern 10. These vertices may form a concave shape which may be generated when the diagonal pattern 10 is enlarged to a straight line. Enlarged layout data may include data from the additionally generated vertex. Due to the additional vertex data, the slivers 25 may be generated during the fracturing process as shown in FIG. 3.

The slivers 23 and 25 may be polygonal regions having a size much less than that of the main fractured regions 21. Specifically, the polygonal regions have the minimum size allowable in the electron beam exposure system. The generation of the slivers 23 and 25 may be a principal factor that greatly increases the number of electron beam exposure shots in a practical exposure process. The increase of the number of the electron beam exposure shots may be a factor that increases the time necessary for electron beam exposure (e.g., by at least a factor of 4). Photo mask pattern defectiveness (e.g., critical dimension defectiveness) may also be caused due to the degradation of a resist layer on which the electron beam exposure is performed.

SUMMARY OF THE INVENTION

The present invention provides a method of forming a mask layout for electron beam exposure that is capable of reducing the generation of slivers when a fracturing process is performed to transfer a layout having a diagonal pattern onto a photo mask.

In accordance with one aspect of the present invention, a method of forming a mask layout includes providing an initial layout in which a diagonal pattern of a first polygon is repeatedly arranged in a diagonal direction relative to a vertical-axis direction. Opposite edge sides of the diagonal pattern of the first polygon are corrected such that second polygons extending in a horizontal-axis direction are stacked at the opposite edge sides of the diagonal pattern of the first polygon to form a stair-shaped layout. The polygons are fractured in the horizontal-axis direction to provide data associated with the corrected layout to an electron beam exposure system.

In accordance with another aspect of the present invention, a method of forming a mask layout is provided. An initial layout is provided with a diagonal pattern of a first polygon. The first polygon is repeatedly arranged in a diagonal direction relative to a vertical-axis direction. An OPC process is performed to introduce a serif-shaped corrected pattern into the diagonal pattern in the shape of a second polygon. The second polygon extends in a horizontal-axis direction such that the polygon intersects a side of the diagonal pattern in the diagonal direction. The polygons are fractured in the horizontal-axis direction to provide data associated with the corrected layout to an electron beam exposure system.

In accordance with another aspect of the present invention, a method of forming a mask layout is provided. An initial layout is provided with a diagonal pattern of a first polygon. The first polygon is repeatedly arranged in a diagonal direction to form a predetermined angle with a vertical-axis direction. An optical proximity correction (OPC) process is performed to provide a serif-shaped corrected pattern to the diagonal pattern in the shape of a second polygon. The second polygon extends in a horizontal-axis direction such that the polygon intersects a side of the diagonal pattern in the diagonal direction. Opposite edge sides of the diagonal pattern of the first polygon are corrected such that third polygons extending in the horizontal-axis direction are stacked at the opposite edge sides of the diagonal pattern of the first polygon to form a stair-shaped layout. The polygons are fractured in the horizontal-axis direction to provide data associated with the corrected layout to an electron beam exposure system.

In accordance with yet another aspect of the present invention, a mask layout formed by the above-described method is provided. The mask layout comprises a diagonal pattern of a first polygon repeatedly arranged in a diagonal direction relative to a vertical-axis direction. A serif-shaped OPC corrected pattern overlapped on a side of the diagonal pattern in the shape of a second polygon extends in a horizontal-axis direction such that the polygon intersects the side of the diagonal pattern in the diagonal direction. Third polygons extend in the horizontal-axis direction. The third polygons are stacked at the opposite edge sides of the diagonal pattern of the first polygon to form a stair-shaped layout.

Preferably, the diagonal pattern of the first polygon is set as a layout to define an active region and a device isolation layer of a memory device.

Preferably, the diagonal pattern of the first polygon is arranged along a $6F^2$ cell layout or a $4F^2$ cell layout, and the memory device is a dynamic random access memory device.

Preferably, the diagonal pattern of the first polygon is arranged at an angle of approximately 27 degrees from the vertical-axis direction.

Preferably, the diagonal pattern of the first polygon is set as a rectangular or trapezoidal layout.

Preferably, the second polygons, which correct the edge sides of the first polygon into a stair-shaped layout, are set as a rectangular or trapezoidal layout represented by angle values of 0, 45, or 90 degrees from the vertical-axis direction or the horizontal-axis direction.

Preferably, a vertical-axis critical dimension of the second polygons, which correct the edge sides of the first polygon into a stair-shaped layout, is set such that the vertical-axis critical dimension of the second polygons is greater than the size of a minimum exposure element allowable in the electron beam exposure system.

Preferably, a corrected pattern of a serif-shaped third polygon for OPC is provided to the diagonal pattern of the first polygon. The third polygon extends in the horizontal-axis direction such that the polygon intersects a side of the diagonal pattern in the diagonal direction.

Preferably, the corrected pattern of the third polygon overlaps the diagonal pattern. Layout data in which the corrected pattern of the third polygon is overlapped on the diagonal pattern is enlarged by the reciprocal of a reduction exposure ratio that is used for the fracturing.

Preferably, the electron beam exposure system is a vector-scan type electron beam exposure system that provides a rectangular or trapezoidal electron beam shape represented by angle values of 0, 45, or 90 degrees from either the vertical-axis direction or the horizontal-axis direction.

DESCRIPTION OF THE SPECIFIC EMBODIMENTS

Figure 1:
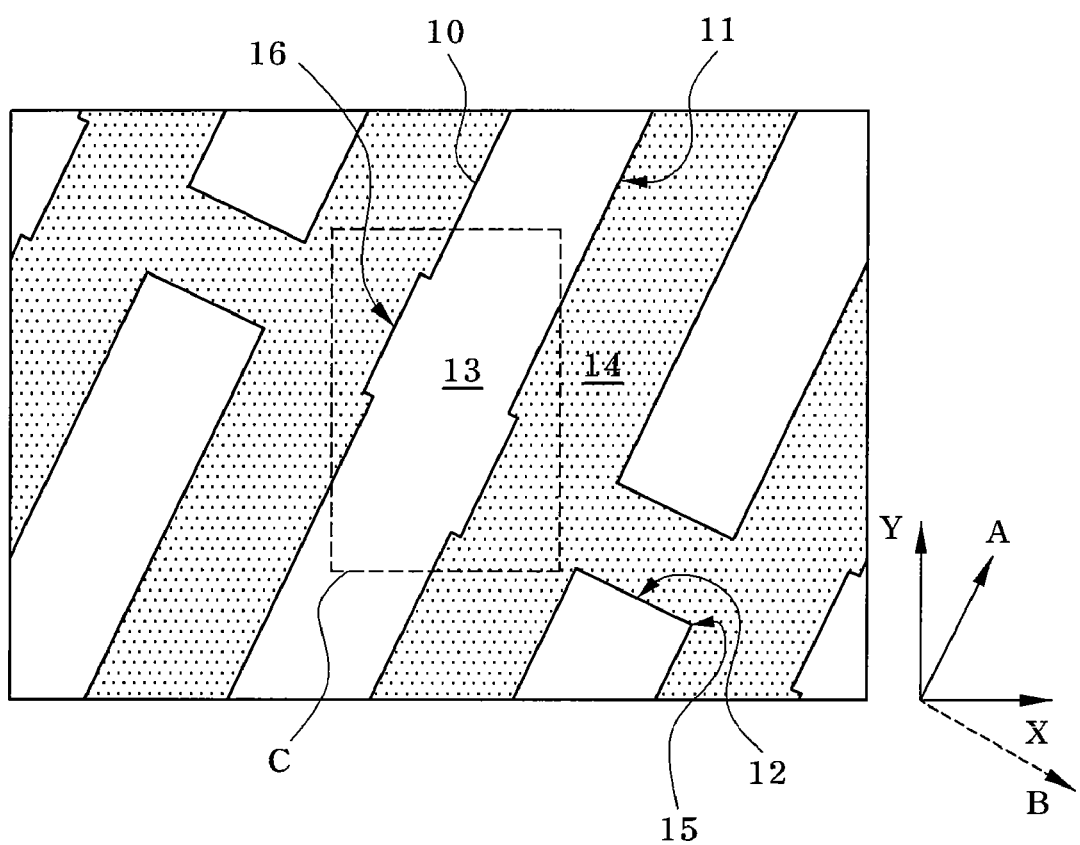
FIG. 1 illustrates a conventional mask layout for a device isolation layer.

The present invention reduces the generation of slivers in a fracturing process for electron beam exposure by changing the design of a $6F^2$ cell layout or a $4F^2$ cell layout. Changes are made to a layout of a diagonal pattern for an active region and a device isolation layer to set the active region. This change to the layout may be made while performing optical proximity correction (OPC).

For example, when the OPC corrected pattern is provided in the shape of a serif polygon, the corrected pattern is not designed to be perpendicular to a side of the diagonal pattern. Rather, the pattern is corrected to form a polygon extending in the horizontal-axis direction, which is the same as the fracturing direction. Consequently, it is possible to exclude or reduce slivers generated in connection with vertices that are generated according to the addition of the corrected pattern.

When the corrected pattern is added, a setting process is not performed such that the corrected pattern is merged with the diagonal pattern. However, data is processed using a computer aided design (CAD) tool such that the corrected pattern is merely overlapped. As a result, undesirable, and therefore, unnecessary vertices are prevented from being generated in the layout of the diagonal pattern when enlarging CAD data of a layout. The layout may include a diagonal pattern designed according to the design rule of the pattern to be realized on a wafer by the reciprocal of a reduction exposure ratio (e.g., an enlargement by a factor of 4 during a 4:1 reduction exposure). Consequently, it is possible to prevent slivers from being generated in connection with the undesirably generated vertices.

The edge side of the diagonal pattern is changed into a stair shape by stacking smaller-sized polygons extending in the horizontal direction during the OPC. Therefore, it is possible to prevent slivers from being generated at the vertices connected with the edge side of the diagonal pattern.

The critical dimension of the smaller-sized polygons for the stair shape (e.g., the critical dimension perpendicular to the fracturing direction) may be set such that the critical dimension has a size greater than the minimum exposure element or the minimum fracture size allowable in an electron beam exposure system. For example, in a vector-scan type electron beam exposure system, the shape of the electron beam is restricted when fracturing is performed. As a result, the fractured regions of the polygons may be divided into regions substantially equal to the polygons.

It is preferable to set the size of the polygons in consideration of optical proximity effect (OPE) such that the stair shape is not transferred onto the wafer. Preferably, the stair shape forms a straight line due to the OPE caused while an image is transferred onto the wafer.

Slivers are reduced during the fracturing process, and therefore the number of electron beam exposure shots is also reduced. After the fracturing process, the volume of layout data required for real electron beam exposure is greatly reduced. The time necessary for electron beam exposure is decreased. It is therefore possible to prevent the fluctuation of the critical dimension of the pattern, which may be generated due to the deformation of the resist layer caused by the increase in the electron beam exposure time. Consequently, it is possible to improve the uniformity of the critical dimension of the resist pattern formed on the photo mask, and therefore the pattern formed on the wafer.

Figure 4:
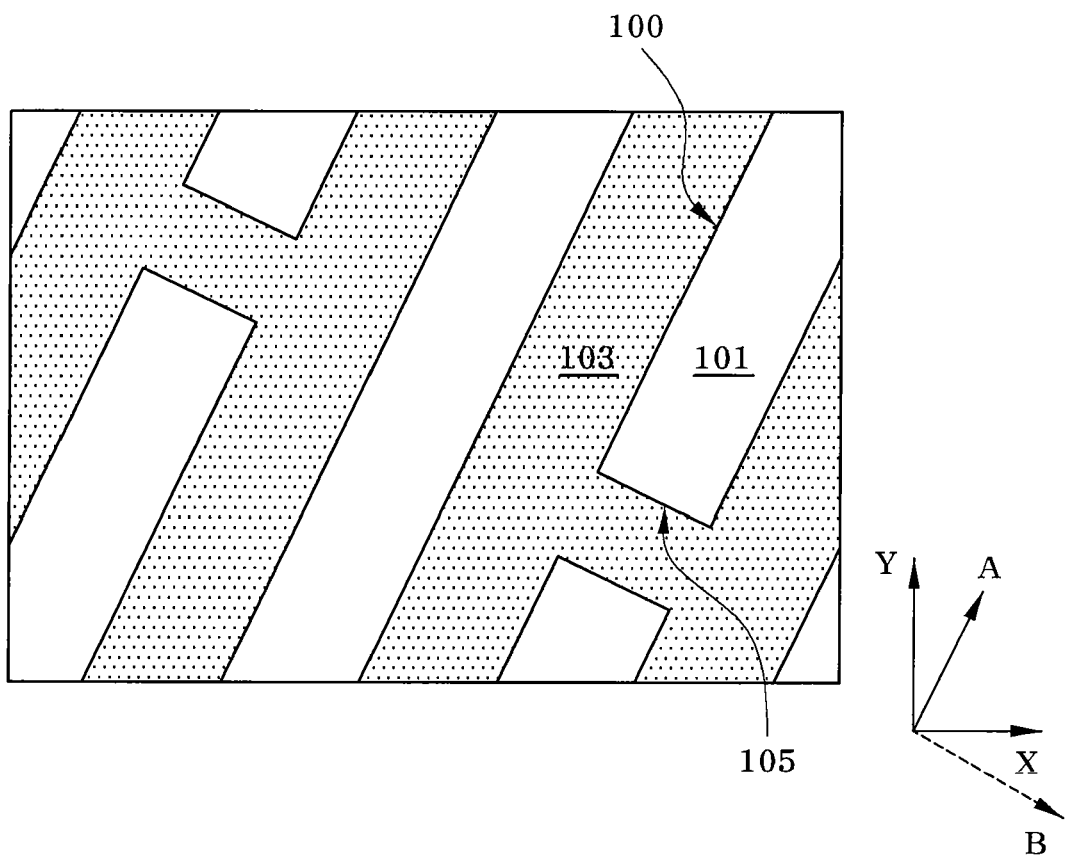
FIG. 4 illustrates an original mask layout according to a preferred embodiment of the present invention.
Figure 7:
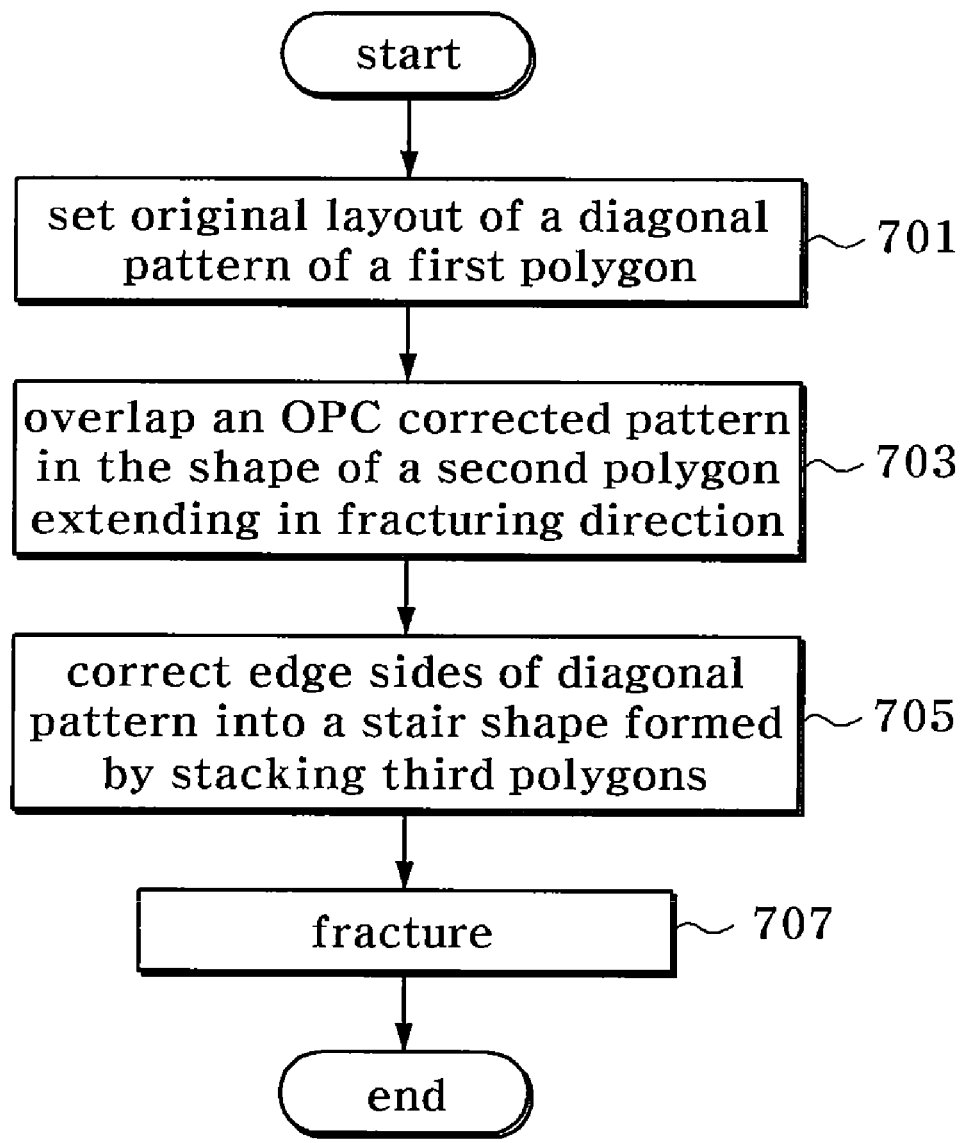
FIG. 7 is a flow chart illustrating a method of forming a mask layout according to a preferred embodiment of the present invention.

Referring first to FIGS. 4 and 7, the mask layout forming method according to the present invention is performed by designing an original layout for a diagonal pattern 100 to be realized on a wafer, as shown in FIG. 4 (701 of FIG. 7).

The diagonal pattern 100 is set in the shape of a rectangular or trapezoidal first polygon. Specifically, the diagonal pattern 100 is set as a layout to define an active region 101 and a device isolation layer 103. The layout of the diagonal pattern 100 is recognized as data having angle values representing the positions of the vertices of the polygon. The data is saved into a file that is readable by a CAD system or an electron beam exposure system (e.g., a graphic data system format file).

In the original layout, the diagonal pattern 100 is preferably drawn along a $6F^2$ cell layout. In the $6F^2$ cell layout, the diagonal pattern 100 extends at an angle of approximately 27 degrees (A) from either the horizontal direction (X), which is a word line direction, or the vertical direction (Y), which is a bit line direction perpendicular to the horizontal direction (X). An edge side 105 of the diagonal pattern 100 extends in the direction (B) that is perpendicular to the diagonal direction (A).

The diagonal pattern 100 may be set such that the diagonal pattern 100 is arranged along a $4F^2$ cell layout. In the $4F^2$ cell layout, the diagonal pattern 100 may be set as a first polygon extending in a diagonal direction which is difficult to express with angle values that can be recognized by the vector-scan type electron beam exposure system (e.g., angle values of 0, 45, or 90 degrees).

Figure 5:
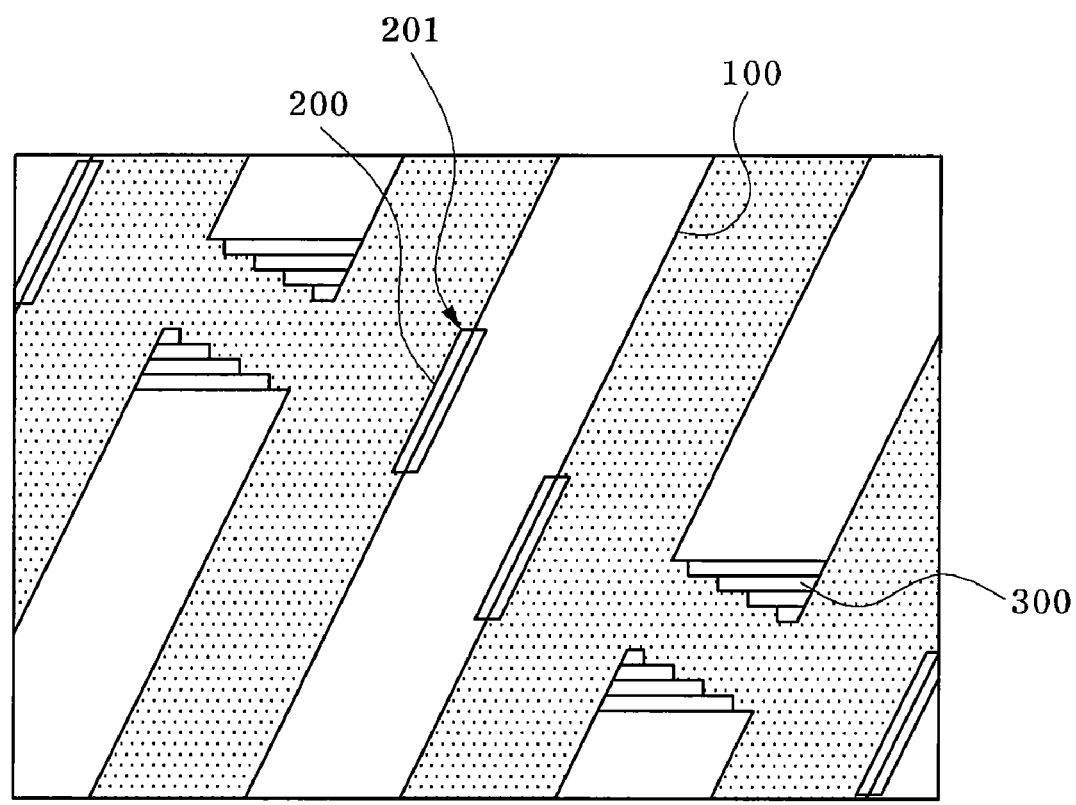
FIG. 5 illustrates a corrected layout obtained by correcting the original mask layout of FIG. 4.

Referring to FIGS. 5 and 7, an OPC process is performed on the layout of the diagonal pattern 100. During the OPC process, the correction or the modification of the layout is performed to prevent generation of slivers during the fracturing process. The layout data associated with the diagonal pattern 100 is then provided to the electron beam exposure system.

The fracturing process may be performed, for example, in the horizontal direction (X). However, the diagonal pattern 100 is formed in the shape of the first polygon extending in the diagonal direction (A). As a result, slivers, which are regions having a size less than that of the undesirably set fractured regions, may be generated. In order to prevent the generation of the slivers, the layout of the diagonal pattern 100 is corrected in consideration of the fracturing process.

The OPC process is performed on the diagonal pattern 100 in consideration of the OPE. Specifically, a serif-shaped OPC corrected pattern 200 is added to the diagonal pattern 100 (703 of FIG. 7). The corrected pattern 200 is overlapped on the diagonal pattern 100 to prepare CAD data, unlike the conventional art in which the corrected pattern 200 is merged with the diagonal pattern 100.

Generally, reduction exposure is used in a photolithography process during the mass production of a semiconductor memory device. The original layout including the diagonal pattern 100 is designed according to the design rule of a device pattern realized on the wafer.

Figure 2:
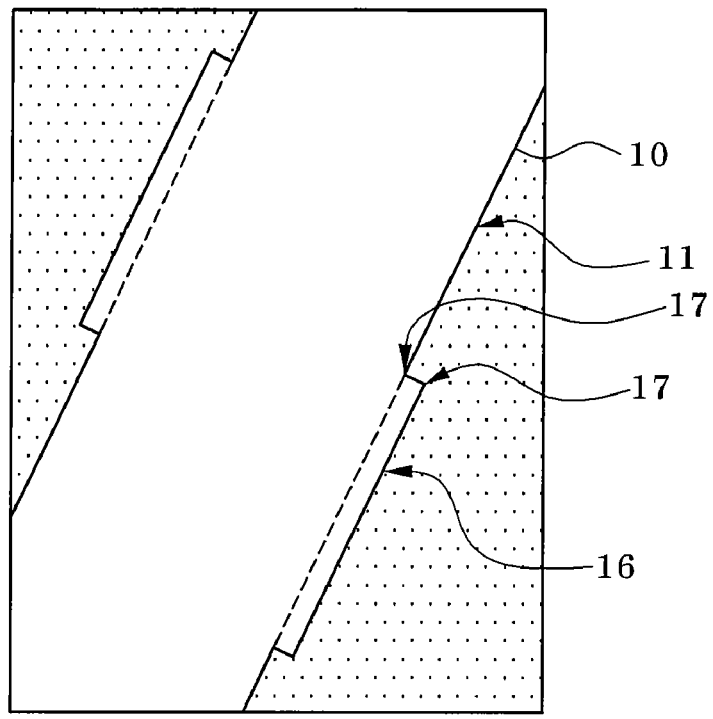
FIG. 2 is an enlarged view of part C of FIG. 1 illustrating the conventional mask layout.

For the pattern to be realized on the photo mask, the original layout data is enlarged by the reciprocal of the reduction ratio of the reduction exposure using the CAD (e.g., an enlargement by a factor of 4 when the reduction exposure is 4:1). The enlarged data is converted into layout data for the photo mask. During the enlarging process, undesirable new vertices may be generated at the side 11 (see FIG. 1) of the diagonal pattern 10 (see FIG. 1) due to new vertices 17 (see FIG. 2) generated by the merge between the diagonal pattern 10 (see FIG. 1) and the corrected pattern 16 (see FIG. 1).

In the fracturing process, slivers may be generated in connection with the new vertices. In order to prevent the generation of the slivers, the fracturing process is performed such that the diagonal pattern 100 and the corrected pattern 200 are processed as independent data when the original layout is enlarged using the CAD. The corrected pattern 200 is overlapped on the diagonal pattern 100 such that the corrected pattern 200 is maintained as independent data without the corrected pattern 200 being merged with the diagonal pattern 100.

A second polygon formed by the corrected pattern 200 is a smaller-sized polygon extending in the horizontal direction (X) such that the polygon intersects the side of the diagonal pattern 100 in the diagonal direction. This is achieved in consideration of the fracturing direction that can be regarded as the lengthwise direction of the fractured regions. Since the fracturing direction is the horizontal direction (X), the serif-shaped corrected pattern 200 is formed in the shape of the second polygon extending in the horizontal direction (X).

The corrected pattern 200 of the second polygon may coincide with the fracturing direction to prevent the generation of additional slivers in connection with vertices 201 representing the second polygon 200. The shape of the second polygon represented by the angle values of the vertices 201 may be the same angle values as the shape of the exposure beam at the time of the electron beam exposure (e.g., 0, 45, or 90 degrees).

Referring back to FIGS. 5 and 7, the opposite edge sides 105 (see FIG. 4) of the diagonal pattern 100 of the first polygon are corrected during the OPC process such that third polygons 300 extending in the horizontal direction are stacked to form a stair-shaped layout (705 of FIG. 7).

Figure 3:
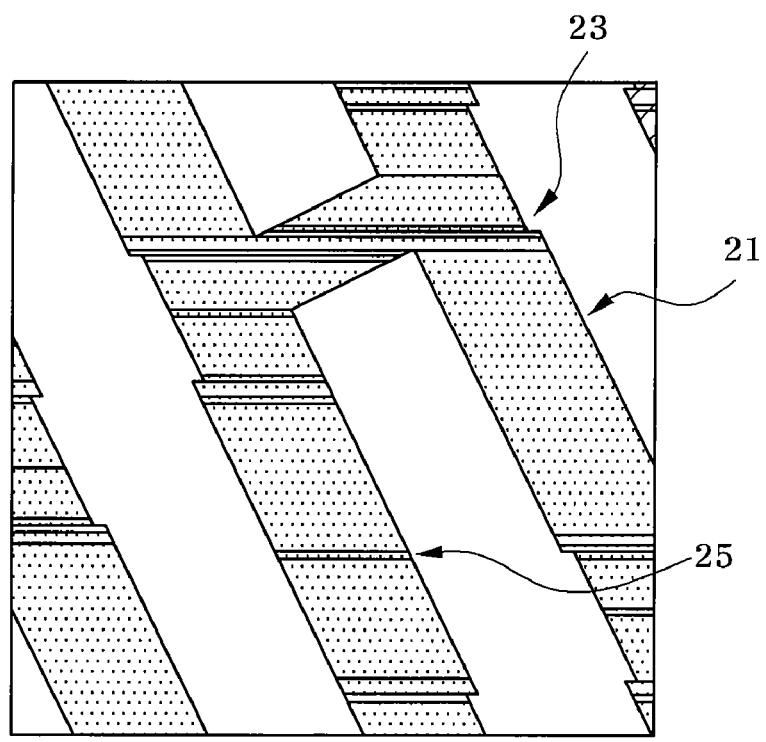
FIG. 3 illustrates the results of fracturing the mask layout of FIG. 1.

The edge sides 105 of the diagonal pattern 100 extend in the direction (B) perpendicular to the diagonal direction (A). When the fracturing process is performed on the edge sides 105, slivers 23 may be generated at adjacent vertices as shown in FIG. 3. In order to prevent the generation of the slivers 23, the third polygons 300 are added in a stacking structure so as to correct the edge sides 105 in the stair shape during the OPC process as shown in FIG. 5.

Preferably, the third polygons 300 are set to a size greater than the size of the minimum exposure element allowable in the electron beam exposure system. For example, the third polygons 300 are set to a size greater than 50 nm; specifically, the third polygons 300 are set to a size of approximately 100 nm. Thus, the critical dimension in the vertical-axis direction (Y) is greater than the minimum element fractured region during the fracturing process. The third polygons 300 are polygons extending in the horizontal direction (X), which is the fracturing direction. The third polygons 300 may be set to a shape that can be represented by angle values recognizable in the electron beam exposure system (e.g., angle values of 0, 45, or 90 degrees). Slivers are not generated in connection with the vertices at the time of fracturing the third polygons 300. Therefore, the third polygons 300 are preferably fractured into equal regions.

Figure 6:
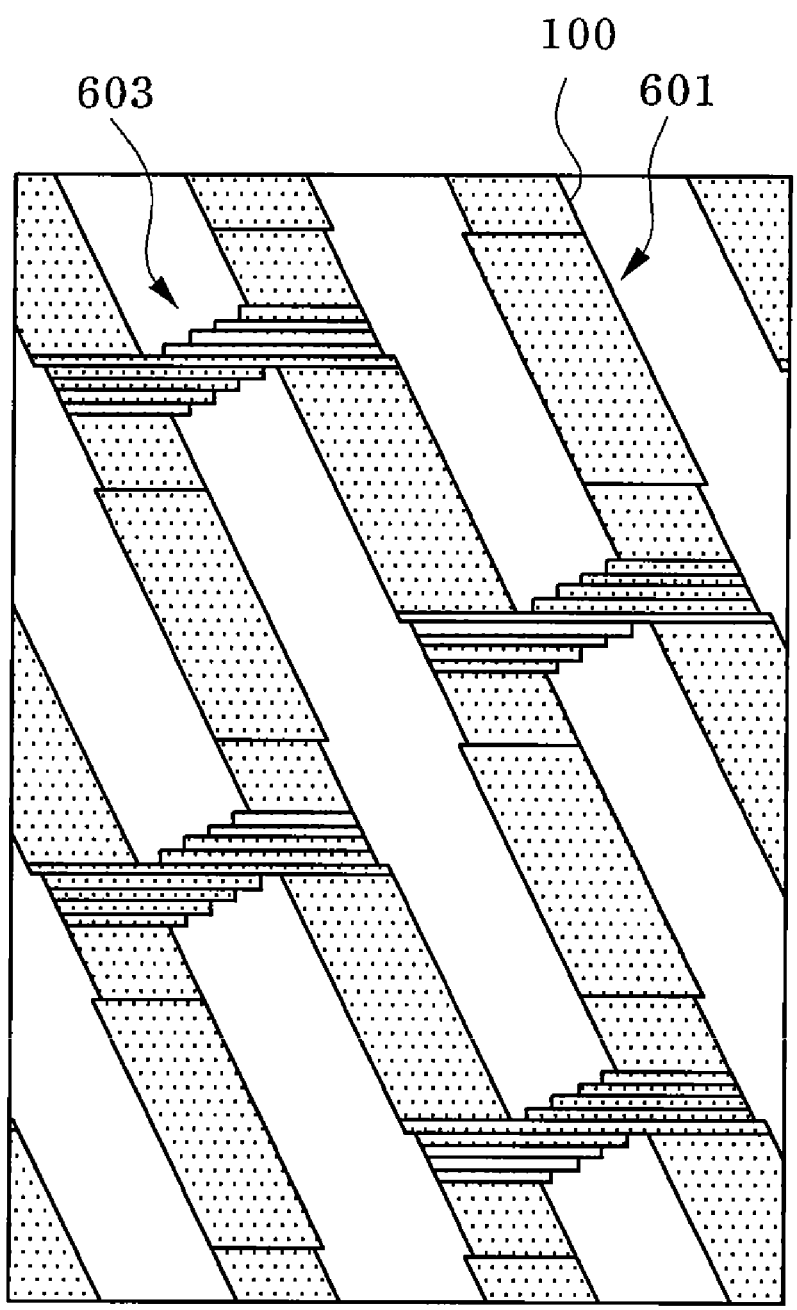
FIG. 6 illustrates the results of fracturing the corrected mask layout of FIG. 4.

Referring to FIGS. 6 and 7, the polygons are fractured into smaller-sized fractured regions in the horizontal direction (X) to provide the layout data associated with the corrected diagonal pattern 100 to the electron beam exposure system.

The electron beam exposure system scans the photo mask with an electron beam to expose the photo mask in consideration of a subsequent fracturing process during the OPC process (707 of FIG. 7).

As a result of the fracturing process, as shown in FIG. 6, slivers are prevented from being generated at the main polygonal part 610 of the diagonal pattern 100. The generation of slivers is also prevented at the edge part 603 of the diagonal pattern 100 by the third polygons 200 (see FIG. 5), substantially forming the stair shape. The results of the fracturing process demonstrate that it is possible to set the minimum critical dimension of the fractured regions to a wider dimension compared to the generation of the slivers 23 and 25 as shown in FIG. 3.

In the conventional art, for example, when the fracturing process is performed in the electron beam exposure system, although the minimum size of the fractured region is set to greater than the minimum exposure element (e.g., 100 nm), the fracturing process is not performed with the set critical dimension due to the generation of the slivers 23 and 25 (see FIG. 3). However, the fracturing process is performed with a size less than the set critical dimension (e.g., 50 nm). As a result, the total number of electron beam exposure shots is greatly increased.

For example, when the fracturing process is performed with a minimum fractured region size of 50 nm, the number of shots is approximately 197,000,000. In this case, the time necessary for the electron beam exposure is approximately 65 hours. According to the present invention, however, generation of the slivers is prevented. Consequently, the size of the minimum fractured region may be increased to approximately 100 nm. As a result, the total number of electron beam exposure shots is reduced to approximately 93,000,000. Therefore, the time necessary for the electron beam exposure is reduced to approximately 30 hours.

It is possible to reduce the electron beam exposure time (or the electron beam writing time), and therefore, to improve productivity. In addition, the exposure time is reduced. The deformation of the degradation of the resist is effectively prevented, and therefore, the uniformity of the critical dimension of the pattern is improved.

Although the embodiment of the present invention is described in connection with a DRAM device using the $6F^2$ cell layout, the present invention may be applied to form a diagonal pattern on a $4F^2$ cell layout, a flash device, an application-specific integrated circuit (ASIC) device, or the like.

As is apparent from the above description, when the layout data of the diagonal pattern is fractured into a data format required for an electron beam exposure system, the generation of slivers is prevented through the correction or the modification of the layout during an OPC process. The present invention prevents the abrupt increase of the layout data after the fracturing process, and therefore, reduces the data volume.

Furthermore, it is possible to reduce the number of exposure shots, and therefore, to effectively reduce the time necessary for electron beam exposure or electron beam writing. In other words, it is possible to increase the size of the fractured regions or the resolution. As a result, the deformation of the pattern due to the deformation of the degradation of the resist resulting from excessive exposure is effectively prevented. Therefore, the uniformity and the fidelity of the critical dimension of the pattern are guaranteed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming a mask layout, the method comprising:
   providing an initial layout in which a diagonal pattern of a first polygon is repeatedly arranged in a diagonal direction relative to a vertical-axis direction;
   correcting opposite edge sides of the diagonal pattern of the first polygon such that second polygons extending in a horizontal-axis direction are stacked at the opposite edge sides of the diagonal pattern of the first polygon to form a stair-shaped layout; and
   fracturing the polygons in the horizontal-axis direction to provide data associated with the corrected layout to an electron beam exposure system.

2. The method according to claim 1, wherein the diagonal pattern of the first polygon is set as a layout to define an active region and an isolation region of a memory device.

3. The method according to claim 2, wherein the diagonal pattern of the first polygon is arranged along one of: a $6F^2$ cell layout or a $4F^2$ cell layout, wherein the memory device is a dynamic random access memory device.

4. The method according to claim 1, wherein the diagonal pattern of the first polygon is arranged at an angle of substantially 27 degrees from the vertical-axis direction.

5. The method according to claim 1, wherein the diagonal pattern of the first polygon is set as one of: a rectangular or trapezoidal layout.

6. The method according to claim 1, wherein the second polygons are set as one of: a rectangular or a trapezoidal layout represented by angle values of one of: 0, 45, or 90 degrees from one of: the vertical-axis direction or the horizontal-axis direction.

7. The method according to claim 1, wherein a vertical-axis critical dimension of the second polygons is set such that the vertical-axis critical dimension of the second polygons is greater than the size of a minimum exposure element allowable in the electron beam exposure system.

8. The method according to claim 1, further comprising providing a corrected pattern of a serif-shaped third polygon for optical proximity correction to the diagonal pattern of the first polygon in the shape of a polygon extending in the horizontal-axis direction such that the polygon intersects a side of the diagonal pattern in the diagonal direction.

9. The method according to claim 8, further comprising:
   overlapping the corrected pattern of the third polygon on the diagonal pattern; and
   enlarging data associated with the layout in which the corrected pattern of the third polygon is overlapped on the diagonal pattern by the reciprocal of a reduction exposure ratio that is used for the fracturing.

10. The method according to claim 1, wherein the electron beam exposure system is a vector-scan type electron beam exposure system that provides one of: a rectangular or a trapezoidal electron beam shape represented by angle values of one of: 0, 45, or 90 degrees from one of: the vertical-axis direction or the horizontal-axis direction.

11. A method of forming a mask layout, the method comprising:
    providing an initial layout in which a diagonal pattern of a first polygon is repeatedly arranged in a diagonal direction relative to a vertical-axis direction;
    performing optical proximity correction to provide a serif-shaped corrected pattern to the diagonal pattern in the shape of a second polygon extending in a horizontal-axis direction such that the polygon intersects a side of the diagonal pattern in the diagonal direction; and
    fracturing the polygons in the horizontal-axis direction to provide data associated with the corrected layout to an electron beam exposure system.

12. The method according to claim 11, wherein the diagonal pattern of the first polygon defines an active region and an isolation region along one of: a $6F^2$ cell layout or a $4F^2$ cell layout.

13. The method according to claim 11, wherein the diagonal pattern of the first polygon is arranged at an angle of substantially 27 degrees from the vertical-axis direction.

14. The method according to claim 11, wherein the performing step comprises correcting opposite edge sides of the diagonal pattern of the first polygon such that third polygons extending in the horizontal-axis direction are stacked at the opposite edge sides of the diagonal pattern of the first polygon to form a stair-shaped layout.

15. The method according to claim 14, wherein a vertical-axis critical dimension of the third polygons is set to be greater than a size of a minimum exposure element allowable in the electron beam exposure system.

16. The method according to claim 11, wherein the performing step comprises:
    overlapping the corrected pattern of the second polygon on the diagonal pattern; and
    enlarging data of the layout in which the corrected pattern of the second polygon is overlapped on the diagonal pattern by the reciprocal of a reduction exposure ratio that is used for the fracturing.

17. A method of forming a mask layout, comprising:
    providing an initial layout in which a diagonal pattern of a first polygon is repeatedly arranged in a diagonal direction relative to a vertical-axis direction;
    performing optical proximity correction to provide a serif-shaped corrected pattern to the diagonal pattern in the shape of a second polygon extending in a horizontal-axis direction such that the polygon intersects a side of the diagonal pattern in the diagonal direction;
    correcting opposite edge sides of the diagonal pattern of the first polygon such that third polygons extending in the horizontal-axis direction are stacked at the opposite edge sides of the diagonal pattern of the first polygon to form a stair-shaped layout; and
    fracturing the polygons in the horizontal-axis direction to provide data associated with the corrected layout to an electron beam exposure system.

18. The method according to claim 17, wherein the performing step comprises:
    overlapping the corrected pattern of the second polygon on the diagonal pattern; and
    enlarging data of the layout in which the corrected pattern of the second polygon is overlapped on the diagonal pattern by the reciprocal of a reduction exposure ratio that is used for the fracturing.

19. A mask layout comprising:
    a diagonal pattern of a first polygon repeatedly arranged in a diagonal direction relative to a vertical-axis direction;
    a serif-shaped optical proximity correcting pattern overlapped on a side of the diagonal pattern in the shape of a second polygon extending in a horizontal-axis direction such that the polygon intersects the side of the diagonal pattern in the diagonal direction; and third polygons extending in the horizontal-axis direction, the third polygons being stacked at opposite edge sides of the diagonal pattern of the first polygon to form a stair-shaped layout.

20. The mask layout according to claim 19, wherein the diagonal pattern of the first polygon defines an active region and an isolation region along one of: a $6F^2$ cell layout or a $4F^2$ cell layout.

* * * * *